(12) United States Patent
Hsaio et al.

(10) Patent No.: US 6,235,587 B1
(45) Date of Patent: May 22, 2001

(54) METHOD OF MANUFACTURING A SEMICONDUCTOR DEVICE WITH REDUCED ARC LOSS IN PERIPHERAL CIRCUITRY REGION

(75) Inventors: Tommy C. Hsaio, Mountain View; Mark T. Ramsbey, Sunnyvale; Yu Sun, Saratoga, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/417,131

(22) Filed: Oct. 13, 1999

(51) Int. Cl.⁷ .............................................. H01L 21/8247
(52) U.S. Cl. .......................................... 438/258; 438/951
(58) Field of Search ................................... 438/257–267, 438/951

(56) References Cited

U.S. PATENT DOCUMENTS

| | | |
|---|---|---|
| 5,635,416 | 6/1997 | Chen et al. . |
| 5,789,294 | 8/1998 | Choi . |
| 5,920,796 | 7/1999 | Wang et al. . |
| 5,933,729 | 8/1999 | Chan . |
| 6,004,843 * | 12/1999 | Huang .................................. 438/241 |

FOREIGN PATENT DOCUMENTS 0592039   4/1994  (EP) .

* cited by examiner

*Primary Examiner*—Richard Booth

(57) ABSTRACT

Improved dimensional accuracy of the gate electrode structure in the peripheral circuitry region of a semiconductor device is achieved by reducing ARC loss during photoresist stripping associated with plural mask formation in the core memory cell region during patterning and ion implantations. Embodiments include sequentially etching the stacked gate electrode structure in the core memory cell region, photoresist stripping and etching to form the gate electrode structure in the peripheral circuitry region. Subsequently, plural maskings and ion implantations are implemented in the core memory cell region with attendant photoresist strippings.

10 Claims, 4 Drawing Sheets

METHOD OF MANUFACTURING A SEMICONDUCTOR DEVICE WITH REDUCED ARC LOSS IN PERIPHERAL CIRCUITRY REGION

RELATED APPLICATIONS

This application contains subject matter similar to subject matter disclosed in copending U.S. patent applications Ser. No. 09/417,130 filed on Oct. 13, 1999 and Ser. No. 09/417,132 filed on Oct. 13, 1999.

TECHNICAL FIELD

The present invention relates to a method of manufacturing a semiconductor device having accurately dimensioned submicron features. The present invention has particular applicability in manufacturing semiconductor devices with a design rule of about 0.15 micron and under with accurately dimensioned gate electrode structures in the peripheral circuitry region.

BACKGROUND ART

The escalating requirements for high density and performance associated with ultra-large scale integration require increasingly denser arrays with reduced feature sizes. Implementation becomes problematic in manufacturing semiconductor devices having a design rule of about 0.15 micron and under, e.g., about 0.12 micron and under.

Semiconductor devices typically comprise a substrate and elements such as transistors and/or memory cells thereon. Various interconnection layers are formed on the semiconductor substrate to electrically connect these elements to each other and to external circuits. Conventional manufacturing techniques typically comprise forming memory cells in a core memory cell region and forming peripheral circuitry. Processing to form features peculiar to the core memory cell region does not usually correspond or is not necessarily optimal to processing for the peripheral circuitry region. For example, conventional methodology requires the use of at least three separate photoresist masks in the core memory cell region which are removed from the ARC overlying the gate electrode layer in the peripheral circuitry region prior to patterning the gate electrode structure in the peripheral circuitry region.

Such conventional methodology requires the formation and removal of different photoresist masks for etching the stacked gate electrode structure, ion implanting impurities to form shallow source/drain extensions and ion implanting impurities to form moderate or heavily doped source/drain implants. These photoresist masks are conventionally removed from the peripheral circuitry region prior to patterning the gate electrode structure of the peripheral circuitry region. However, each time the photoresist is stripped from the ARC, some of the ARC is lost, thereby altering its functional capabilities with respect to avoiding deleterious reflections during photoresist patterning. Consequently, a loss of critical dimension is encountered upon subsequent patterning of the underlying gate electrode structure.

As miniaturization proceeds apace, the loss of dimensional accuracy, including in the peripheral circuitry region, becomes acutely problematic.

Accordingly, a need exists for methodology enabling accurate patterning of a gate electrode structure in the peripheral circuitry region, notwithstanding the use of a plurality of masks in the core memory cell region which require stripping.

SUMMARY OF THE INVENTION

An advantage of the present invention is a method of manufacturing a semiconductor device having an accurately dimensioned gate electrode structure in the peripheral circuitry region.

Additional advantages and features of the present invention will be set forth in the description which follows and, in part, will become apparent to those having ordinary skill in the art upon examination of the following and may be learned from the practice of the present invention. The advantages of the present invention may be realized and obtained as particularly pointed out in the appended claims.

According to the present invention, the foregoing and other advantages are achieved in part by a method of manufacturing a semiconductor device comprising a core memory cell region and a peripheral circuitry region, the method comprising the following steps: (a) forming a first gate electrode stack in the memory cell region, the first gate electrode stack comprising, sequentially: a tunnel dielectric layer; a charge storage elecrode layer, e.g., a floating gate electrode layer; a dielectric layer; a control gate electrode layer; and an anti-reflective coating (ARC); (b) forming a second gate electrode stack in the peripheral circuitry region, the second gate electrode stack comprising, sequentially: a dielectric layer; a gate electrode layer; and an ARC; (c) depositing a first layer of photoresist material over the core memory cell and peripheral circuitry regions; (d) forming a first photoresist mask on the first gate electrode stack; (e) etching the first gate electrode stack, while the second gate electrode stack is masked by the first layer of photoresist material, to form at least one first gate electrode structure comprising, sequentially: a tunnel dielectric; a charge storage electrode; an intergate dielectric; a control gate electrode; and an ARC; (f) removing the first photoresist mask from the core memory cell region and the first layer of photoresist material from the peripheral circuitry region; (g) forming a second photoresist layer over the core memory cell and peripheral circuitry regions; (h) forming a second photoresist mask on the second gate electrode stack; and (i) etching the second gate electrode stack to form a stacked gate electrode structure comprising, sequentially: a gate dielectric; a gate electrode; and an ARC.

Embodiments of the present invention include the further manipulative steps of: removing the second photoresist mask from the peripheral circuitry region and second layer of photoresist material from the core memory cell region; depositing a third layer of photoresist material over the core memory cell and peripheral circuitry regions; forming a third photoresist mask over the core memory cell region; ion implanting impurities to form shallow source/drain extension implants associated with each stacked gate electrode structure; removing the third photoresist mask from the core memory cell region and third layer photoresist material from the peripheral circuitry region; forming a fourth photoresist mask over the core memory cell region and ion implanting impurities to form moderately or heavily doped source/drain implants. Subsequent processing includes annealing to activate the ion implanted regions.

Additional advantages of the present invention will become readily apparent to those skilled in this art from the following detailed description, simply by way of illustration of the best mode contemplated for carrying out the present invention. As will be realized, the present invention is capable of other and different embodiments, and its several details are capable of modifications in various obvious respects, all without departing from the present invention.

Accordingly, the drawings and descriptions should be regarded as a illustrative in nature, and not as restrictive.

DESCRIPTION OF THE INVENTION

Figure 1:
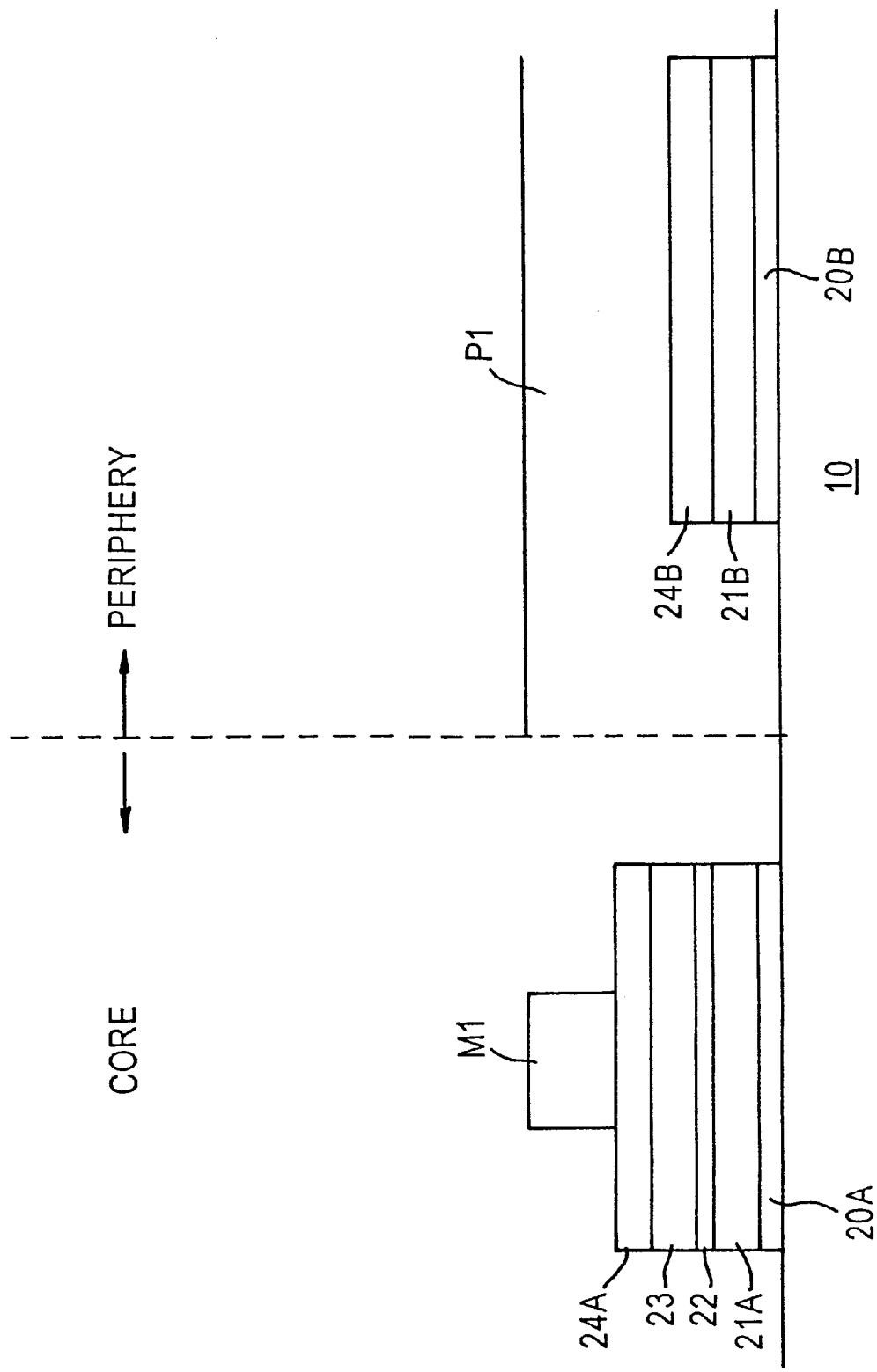
FIGS. 1–4 represents sequential phases in accordance with an embodiment of the present invention.

The present invention addresses and solves the problem of ARC loss in the peripheral circuitry region prior to patterning the gate electrode structure as a result of plural photoresist stripping steps attendant upon forming the gate electrode stack and source/drain regions in the core memory cell region. During conventional practices, the ARC in the peripheral circuitry region is degraded by virtue of stripping at least three layers of photoresist material, as with sulfuric acid with or without an oxygen plasma, to implement formation of transistors in the core memory cell region prior to patterning the gate electrode structure in the peripheral circuitry region. In accordance with embodiments of the present invention, the ARC in the peripheral circuitry region is exposed to only a single photoresist stripping step prior to patterning to form the gate electrode structure in the peripheral circuitry region.

Embodiments of the present invention include initially etching the stacked gate electrode structure in the core memory cell region and then stripping the photoresist mask and layer of photoresist, thereby exposing the ARC in the peripheral circuitry region to only a single photoresist stripping step. A second photoresist mask is then formed in the peripheral circuitry region and the gate electrode structure of the peripheral circuitry region patterned. Subsequently, shallow source/drain extensions and moderately or heavily doped source/drain implants are formed in the core memory cell region. The formation of such implants requires two additional photoresist masks and attendant photoresist layer strippings. However, the stripping of photoresist material attendant upon formation of such ion implantation masks is conducted subsequent to patterning the gate electrode structure in the peripheral circuitry region and, hence, does not adversely impact the integrity of the ARC prior to patterning, thereby improving the accuracy of the gate electrode structure in the peripheral circuitry region. Subsequently, annealing is conducted to activate the implanted regions and the ARC is removed from the core memory cell and peripheral circuitry regions in a conventional manner, as with phosphoric acid.

Embodiments of the present invention comprise forming a double diffused shallow source/drain extensions comprising a first impurity such as arsenic and a second impurity such as phosphorus, wherein the second impurity has a higher diffusion coefficient or diffusivity than the first impurity. For example, the shallow source/drain extension implants can be formed by implanting phosphorus at an implantation dosage of about $1 \times 10^3$ atoms $cm^{-2}$ to about $5 \times 10^{14}$ atoms $cm^{-2}$ at an implantation energy of about 20 to about 100 KeV, and implanting arsenic at an implantation dosage of about $5 \times 10^{14}$ to about $8 \times 10^{15}$ atoms $cm^{-2}$ at an implantation energy of about 20 to about 100 KeV. Activation annealing can be conducted at a temperature of about 900° C. to about 1000° C. for about 10 to 30 seconds.

An embodiment of the present invention is schematically illustrated in FIGS. 1–4, wherein similar features are denoted by similar reference numerals. As indicated, FIG. 1 illustrates a portion of a core memory cell region (core) and a peripheral circuitry region (periphery). An initial phase illustrated in FIG. 1 is consistent with conventional practices and comprises the formation of a tunnel dielectric layer 20A and gate electrode layer 20B on substrate 10. A charge storage electrode layer 21A and gate electrode layer 21B are then formed. Intergate dielectric layer 22 is then formed on the floating gate electrode layer 21A and can comprise silicon oxide, silicon nitride, or a conventional stacked silicon dioxide/silicon nitride/silicon dioxide (ONO) structure. Control gate electrode layer 23 is then deposited followed by deposition of ARC layer 24A and 24B typically at a thickness of about 200 Å to about 350 Å. The tunnel dielectric layer and gate dielectric layers 20A and 20B can comprise, for example, silicon oxide, while the gate electrode layers 21A, 21B and 23 can comprise doped polycrystalline silicon. The ARC layer can comprise any material conventionally employed as an ARC, e.g., silicon oxynitride. The first photoresist layer P1 is then deposited and the first photoresist mask M1 formed on the gate stack in the core.

Figure 2:
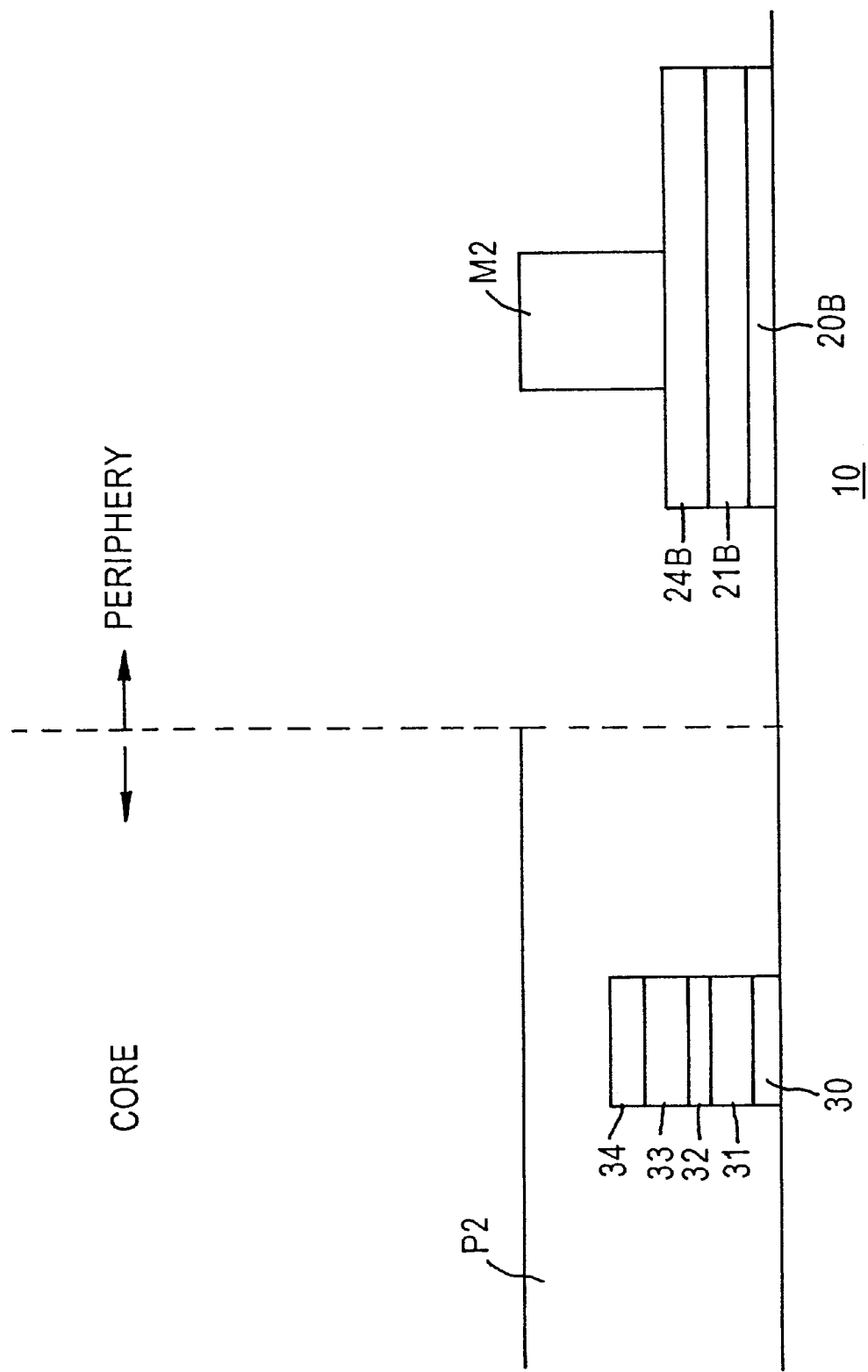

Adverting to FIG. 2, the gate electrode stack in the core is patterned, as by anisotropic etching, to form a stacked gate electrode structure comprising tunnel dielectric 30, charge storage electrode 31, intergate dielectric 32, control gate electrode 33, and ARC 34. The first layer of photoresist material P1 and first photoresist mask M1 are then stripped, which constitutes the first exposure of ARC 24B in the periphery to photoresist stripping.

Figure 3:
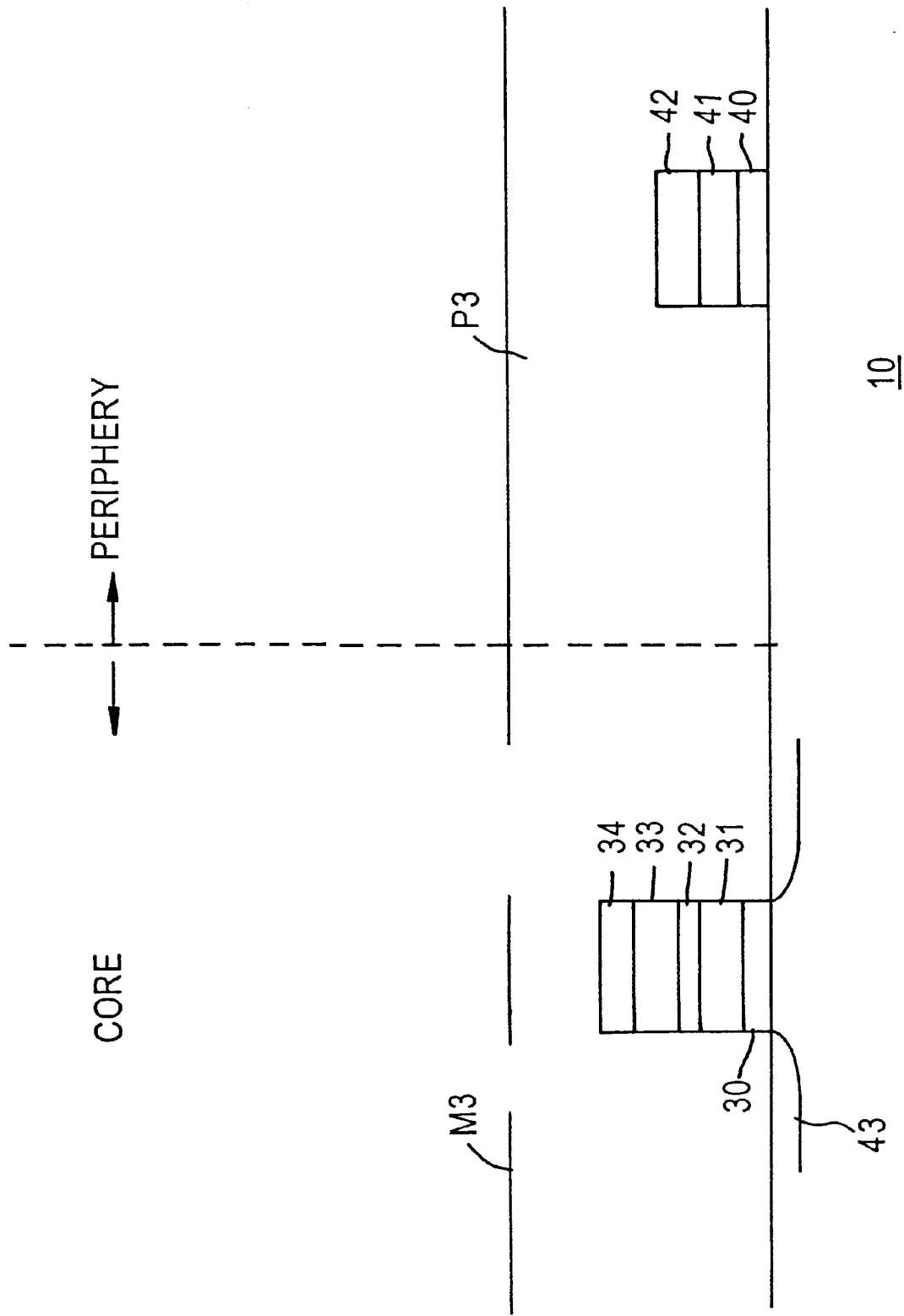

As illustrated in FIG. 2, a second layer of photoresist material P2 is then deposited and a second photoresist mask M2 formed in the periphery overlying the gate electrode stack. The gate electrode stack in the periphery is then patterned, as by anisotropic etching, as schematically illustrated in FIG. 3, to form a gate electrode structure comprising gate dielectric layer 40, gate electrode 41 and ARC 42. The second photoresist mask M2 and second layer photoresist material P2 are then stripped.

Figure 4:
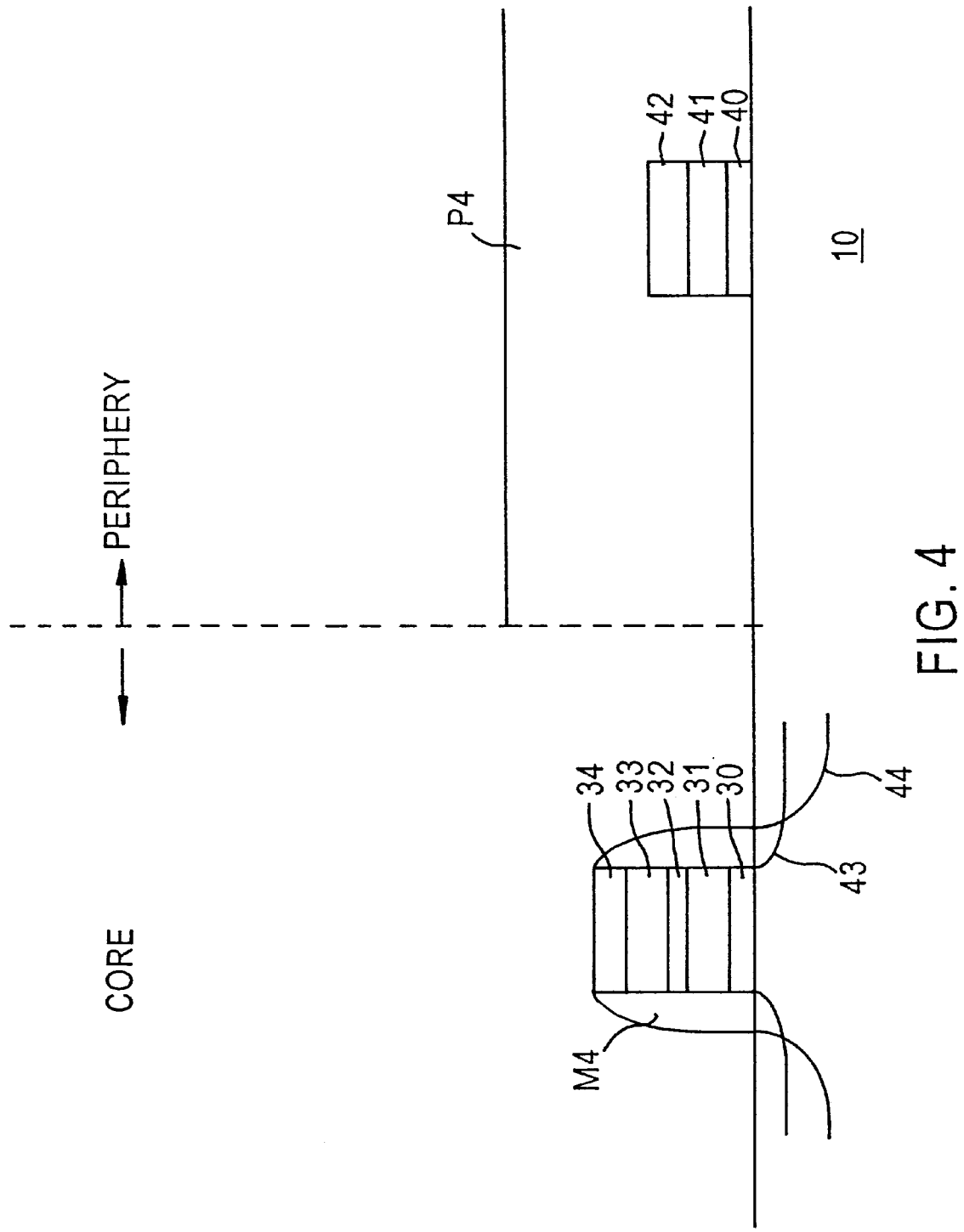

As illustrated in FIG. 3, a third layer of photoresist material P3 is then deposited and a third photoresist mask M3 formed in the core. Ion implantation is then conducted to form shallow source/drain extension implants 43. The third layer of photoresist material P3 and third photoresist mask M3 are then removed. As shown in FIG. 4, a layer of dielectric material P4, e.g., silicon dioxide, is then deposited and a fourth mask M4 is formed in the core. Fourth mask M4 comprises dielectric sidewall spacers, such as silicon dioxide, which serve as a mask during ion implantation to form moderately or heavily doped source/drain implants 44. Dielectric layer P4 and fourth mask M4 are then removed followed by removal of ARCs 34 and 42, as with phosphoric acid.

Various procedures employed, such as forming the source/drain implants in the periphery, as well as activation annealing and particular deposition techniques have not been set forth in detail in order to avoid obscuring the inventive contribution. It should be understood that additional processing steps are performed during the sequence of steps illustrated in FIGS. 1–4 which have not been set forth in detail to avoid obscuring the features of the present invention. For example, processing would also include pre-implant oxidation after the periphery gate etch, periphery shallow source/drain implants after the core implants, spacer formation in the periphery and periphery source/drain implantations.

As illustrated in FIGS. 1–4, the gate electrode structure in the periphery is etched after removing the first layer of photoresist material and first photoresist mask M1 to minimize loss of ARC 42 in the periphery, thereby improving the dimensional accuracy of the patterned gate electrode structure. Conventional practices are more attentive to the requirements of the core memory cell region as it requires greater processing. Accordingly, conventional practices are traditionally focused upon completing processing the core memory cell region prior to addressing the requirements of the peripheral circuitry region. However, the numerous photoresist stripping steps, e.g., typically about three, prior to patterning the gate electrode structure in the peripheral circuitry region results in a loss of ARC, thereby resulting in a loss of accuracy in critical dimensions of the features in the peripheral circuitry region, notably the gate electrode structure. This problem becomes particularly acute as feature sizes plunge into the deep submicron range.

The present invention comprises a strategic sequence of manipulative steps wherein the gate electrode structure is etched in the peripheral circuitry region after the first photo resist stripping, thereby minimizing ARC loss and, hence, improving the accuracy of the etched features in the peripheral circuitry region.

In the previous description, numerous specific details are set forth, in order to provide a better understanding of the present invention. However, the present invention can be implemented without resorting to the details specifically set forth.

In other instances, conventional processing materials and techniques have not been described in detail in order not to unnecessarily obscure the present invention.

The present invention enjoys industrial utility in manufacturing any of various types of semiconductor devices, particularly semiconductor devices having features in the deep submicron range, such as semiconductor devices having a feature size of about 0.15 micron and under, e.g., about 0.12 micron and under. The present invention enables manufacturing highly integrated semiconductor devices with improved dimensional accuracy of features in the peripheral circuitry region.

Only the preferred embodiment of the present invention and an example of its versatility is shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device having a core memory cell region and a peripheral circuitry region, the method comprising the following steps:
   (a) forming a first gate electrode stack in the memory cell region, the first gate electrode stack comprising, sequentially:
      a tunnel dielectric layer;
      a charge storage electrode layer;
      a dielectric layer;
      a control gate electrode layer; and
      an anti-reflective coating (ARC);
   (b) forming a second gate electrode stack in the peripheral circuitry region, the second gate electrode stack comprising:
      a dielectric layer;
      a gate electrode layer; and
      an ARC;
   (c) depositing a first layer of photoresist material over the core memory cell and peripheral circuitry regions;
   (d) forming a first photoresist mask on the first gate electrode stack;
   (e) etching the first gate electrode stack, while the second gate electrode stack is masked by the first layer of photoresist material, to form at least one stacked gate electrode structure comprising, sequentially:
      a tunnel dielectric;
      a charge storage electrode;
      an intergate dielectric;
      a control gate electrode; and
      an ARC;
   (f) removing the first photoresist mask from the core memory cell region and first layer of photoresist material from the peripheral circuitry region;
   (g) forming a second layer of photoresist material over the core memory cell and peripheral circuitry regions;
   (h) forming a second photoresist mask on the second gate electrode stack;
   (i) etching the second gate electrode stack to form a second gate electrode structure comprising, sequentially:
      a gate dielectric;
      a gate electrode; and
      an ARC.

2. The method according to claim 1, comprising performing step (i) while the core memory cell region is masked by the second layer of photoresist material.

3. The method according to claim 1, further comprising:
   (j) removing the second photoresist mask from the peripheral circuitry region and the second layer of photo resist material from the core memory cell region; and
   (k) implanting impurities to form source/drain regions in the core memory cell region.

4. The method according to claim 3, comprising, performing step (k) by:
   ($k_1$) depositing a third layer of photoresist material over the core memory cell and peripheral circuitry regions;
   ($k_2$) forming a third photoresist mask over the core memory cell region;
   ($k_3$) implanting impurities, employing the third photoresist mask, to form shallow source/drain extension implants associated with each stacked gate electrode structure;
   ($k_4$) removing the third mask from the core memory cell region;
   ($k_5$) forming a fourth mask over the core memory cell region;
   ($k_6$) implanting impurities, employing the fourth mask, to form moderate or heavily doped source/drain implants associated with each stacked gate electrode structure;
   ($k_7$) removing the fourth mask; and
   ($k_8$) activation annealing.

5. The method according claim 4, wherein step ($k_3$) comprises:
   implanting first and second impurities of the same conductivity type, wherein the second impurity has a greater diffusion coefficient than the first impurity.

6. The method according to claim 5, where the first impurity comprises arsenic and the second impurity comprises phosphorus.

7. The method according to claim 4, wherein:
   ($k_4$) comprises removing the third layer of photoresist material from the peripheral circuitry region; and
   ($k_7$) comprises removing the fourth layer of photoresist material from the peripheral circuitry region.

8. The method according to claim 1, wherein the:
gate electrode, charge storage electrode and control gate electrode comprise doped polycrystalline silicon;
gate dielectric comprises silicon dioxide; and
intergate dielectric comprises a stack of sequential layers of silicon dioxide, silicon nitride and silicon dioxide.

9. The method according to claim 1, wherein the ARC comprises silicon oxynitride.

10. The method according to claim 1, wherein the:
charge storage electrode comprises doped polycrystalline silicon; and
gate dielectric and intergate dielectric comprise silicon dioxide.

* * * * *